(12) United States Patent
Lee et al.

(10) Patent No.: US 7,492,215 B2
(45) Date of Patent: Feb. 17, 2009

(54) POWER MANAGING APPARATUS

(75) Inventors: Chao-Cheng Lee, Hsin-Chu (TW);
Tzu-Chien Tzeng, Hsin-Chu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 27 days.

(21) Appl. No.: 11/746,059

(22) Filed: May 8, 2007

(65) Prior Publication Data

US 2007/0262810 A1 Nov. 15, 2007

(30) Foreign Application Priority Data

May 10, 2006 (TW) .............................. 95116546 A

(51) Int. Cl.
*H02J 1/00* (2006.01)
(52) U.S. Cl. ..................... 327/544; 327/534; 307/80; 307/85
(58) Field of Classification Search ................. None
See application file for complete search history.

(56) References Cited

U.S. PATENT DOCUMENTS

| | | | | |
|---|---|---|---|---|
| 6,118,328 A | * | 9/2000 | Morikawa ................... 327/534 |
| 6,559,708 B2 | * | 5/2003 | Notani ......................... 327/537 |
| 6,833,748 B2 | * | 12/2004 | Cho ............................ 327/374 |
| 6,914,803 B2 | * | 7/2005 | Yamaoka et al. ............ 365/154 |
| 6,946,865 B2 | * | 9/2005 | Mizuno et al. .............. 324/765 |
| 7,123,076 B2 | * | 10/2006 | Hatakeyama et al. ....... 327/534 |

* cited by examiner

*Primary Examiner*—Donovan Lincoln
*Assistant Examiner*—Terry L Englund
(74) *Attorney, Agent, or Firm*—Winston Hsu

(57) ABSTRACT

A power managing apparatus is utilized to control a first supply voltage, a second supply voltage, and a substrate voltage of a digital circuit. The power managing apparatus includes a voltage generating device, for generating a first reference voltage and a second reference voltage; and a voltage switching device, coupled to the voltage generating device, for adjusting the first supply voltage, the second supply voltage, and the substrate voltage. When the digital circuit operates in a first operating mode, the voltage switching device outputs the second reference voltage to be the first supply voltage and the substrate voltage; and when the digital circuit operates in a second operating mode, the voltage switching device outputs the first reference voltage to be the first supply voltage, and outputs the second reference voltage to be the second supply voltage.

20 Claims, 3 Drawing Sheets

POWER MANAGING APPARATUS

BACKGROUND OF THE INVENTION

1. Field of the Invention

The present invention is related to power management, and more particularly, to a power management circuit using a voltage regulator to control the substrate bias and supply voltage in a CMOS digital circuitry.

2. Description of the Prior Art

With the advances in complementary metal oxide semiconductor (CMOS) technology, the channel length and the diffusion area of a transistor are decreased, which has an advantage of low parasitic capacitance effect in a CMOS circuitry. However, when the diffusion area of the transistor is reduced, the short channel effect will occur. It will increase the leakage current of the transistor to further cause larger power consumption in an integrated circuit. In order to overcome such problem, body biasing apparatus is designed. The body biasing apparatus in the CMOS circuit is capable of decreasing the junction capacitance between the diffusion region and substrate.

Please refer to FIG. 1. FIG. 1 is diagram illustrating a conventional body biasing apparatus 10. The conventional body biasing apparatus 10 utilizes a charge pump 14a, 14b to generate a positive voltage V+ that is higher than a system voltage (Vdd), and to generate a negative voltage V− that is lower than a ground voltage (Vgnd), respectively control the body of the PMOS transistor MP and the body of the NMOS transistor MN of CMOS circuit 12. In normal operation, switching control signal SB_enable controls switches 16a, 16b to selectively connect to the system voltage Vdd and the ground voltage Vss. In other words, the body of the PMOS transistor MP and the body of the NMOS transistor MN are respectively connected to the system voltage Vdd and the ground voltage Vss. Please note that, when the source of the PMOS transistor MP and the source of the NMOS transistor MN are respectively connected to the system voltage Vdd and the ground voltage Vss, the body of the PMOS transistor MP and the body of the NMOS transistor MN are also connected to the system voltage Vdd and the ground voltage Vss, respectively. Alternatively, when system operates in standby mode, switching control signal SB_enable controls switch 16a to choose voltage V+, then the substrate of the PMOS transistor MP is connected to a voltage that is higher than the system voltage Vdd. Accordingly, the threshold voltage of PMOS transistor MP is thereby increased that will reduce the leakage current because the substrate voltage is higher than the source voltage. Similarly, in the standby mode, switching control signal SB_enable controls switch 16b to choose voltage V− to thereby increase the threshold voltage of NMOS transistor MN that will also reduce the leakage current.

However, the operation of charge pumps 14a, 14b is driven by an oscillator that provides the clock signal to control the charging and the discharging of the capacitor, therefore an extra consume current is required by the conventional body biasing apparatus 10 that will increase the number of devices on the chip. Furthermore, if the voltage V+, V− is provided by, for example, an off chip source, then not all of the voltage can be supplied from off chip, thereby some of the pins of the chip will be needed for adding the receiving voltage V+, V−.

SUMMARY OF THE INVENTION

It is therefore an objective of the present invention is to provide a power managing apparatus that utilizes a body biasing and provide a supply voltage, to solve the above-mentioned problems.

According to an embodiment of the present invention, a power managing apparatus is disclosed. The power managing apparatus, for controlling a first supply voltage, a second supply voltage, and a substrate voltage of a digital circuit, includes: a voltage generating device, for generating a first reference voltage and a second reference voltage; a voltage switching device, coupled to the voltage generating device, for adjusting the first supply voltage, the second supply voltage, and the substrate voltage; wherein when the digital circuit operates in a first operating mode, the voltage switching device outputs the second reference voltage to be the first supply voltage and be the substrate voltage; and when the digital circuit operates in a second operating mode, the voltage switching device outputs the first reference voltage to be the first supply voltage, and outputs the second reference voltage to be the second supply voltage.

According to another embodiment of the present invention, a power managing apparatus is disclosed. The power managing apparatus is for controlling supply voltage of transistors in a digital circuit, where the digital circuit comprises at least a PMOS transistor and an NMOS transistor. The power managing apparatus includes: a voltage generating device, for generating a first reference voltage and a second reference voltage; and a voltage switching device, coupled to the voltage generating device, for adjusting the supply voltage of the PMOS transistor and the NMOS transistor. When the digital circuit operates in a first operating mode, the voltage switching device outputs the second reference voltage to source terminal of the PMOS and body of the PMOS; and when the digital circuit operates in a second operating mode, the voltage switching device outputs the first reference voltage to source terminal of the PMOS transistor, and outputs the second reference voltage to source terminal of the NMOS transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
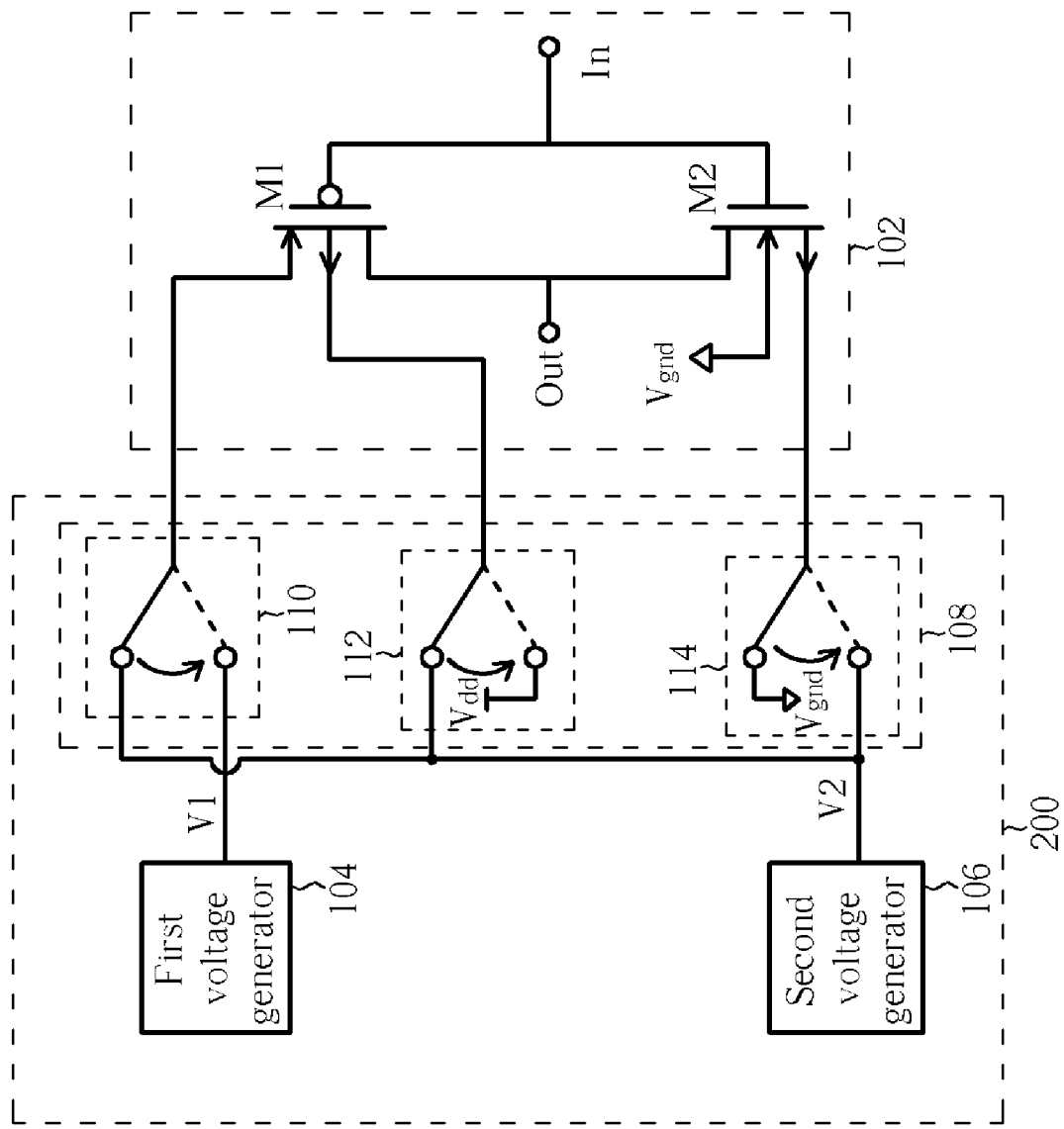
FIG. 2 is a diagram illustrating a power managing apparatus according to an embodiment of the present invention.

Please refer to FIG. 2. FIG. 2 is a diagram illustrating a power managing apparatus 200 according to an embodiment of the present invention. The power managing apparatus 200 is utilized for biasing a CMOS circuit. Please note that to the power managing apparatus 200 is intended to represent an embodiment and is not a limitation of the present invention, specifically, the PMOS transistor and NMOS transistors are not limiting factors. In FIG. 2, the P-substrate of the NMOS transistor M2 is connected to ground (e.g., connected to a ground voltage Vgnd). The power managing apparatus 200 comprises a first voltage generator 104, a second voltage generator 106, and a voltage switching apparatus 108. The first voltage generator 104 is utilized for providing a first reference voltage V1 PMOS transistor M1; the second voltage generator 106 is utilized for providing a second reference voltage V2 to NMOS transistor M2, wherein both the first, second reference voltages V1, V2 are positive voltages and the first reference voltage V1 is higher than the second reference voltage V2.

The voltage switching apparatus 108 is coupled to a first, and a second voltage source 104, 106, a first system voltage Vdd, a ground voltage Vgnd, a PMOS transistor M1, and an NMOS transistor M2. In this embodiment, the first, and the second voltage generator 104, 106 are implemented by a voltage regulator. For the voltage switching apparatus 108, a first switching device 110 is coupled to the source of the PMOS transistor M1 and the second voltage source 106 in a first circuit connecting configuration, and coupled to the source of the PMOS transistor M1 and the first voltage source 104 in a second circuit connecting configuration; a second switching device 112 is coupled to the substrate of the PMOS transistor M1 and the second voltage source 106 is in the first circuit connecting configuration, and coupled to the substrate of the PMOS transistor M1 and a third reference voltage (such as the system voltage Vdd) is in the second circuit connecting configuration. In this embodiment, the third reference voltage is higher than the first reference voltage; and a third switching device 114 coupled to the source of the NMOS transistor M2 and the ground voltage Vgnd in the first circuit connecting configuration, and coupled to the source of the NMOS transistor M2 and the second voltage source 106 in the second circuit connecting configuration.

Figure 1:
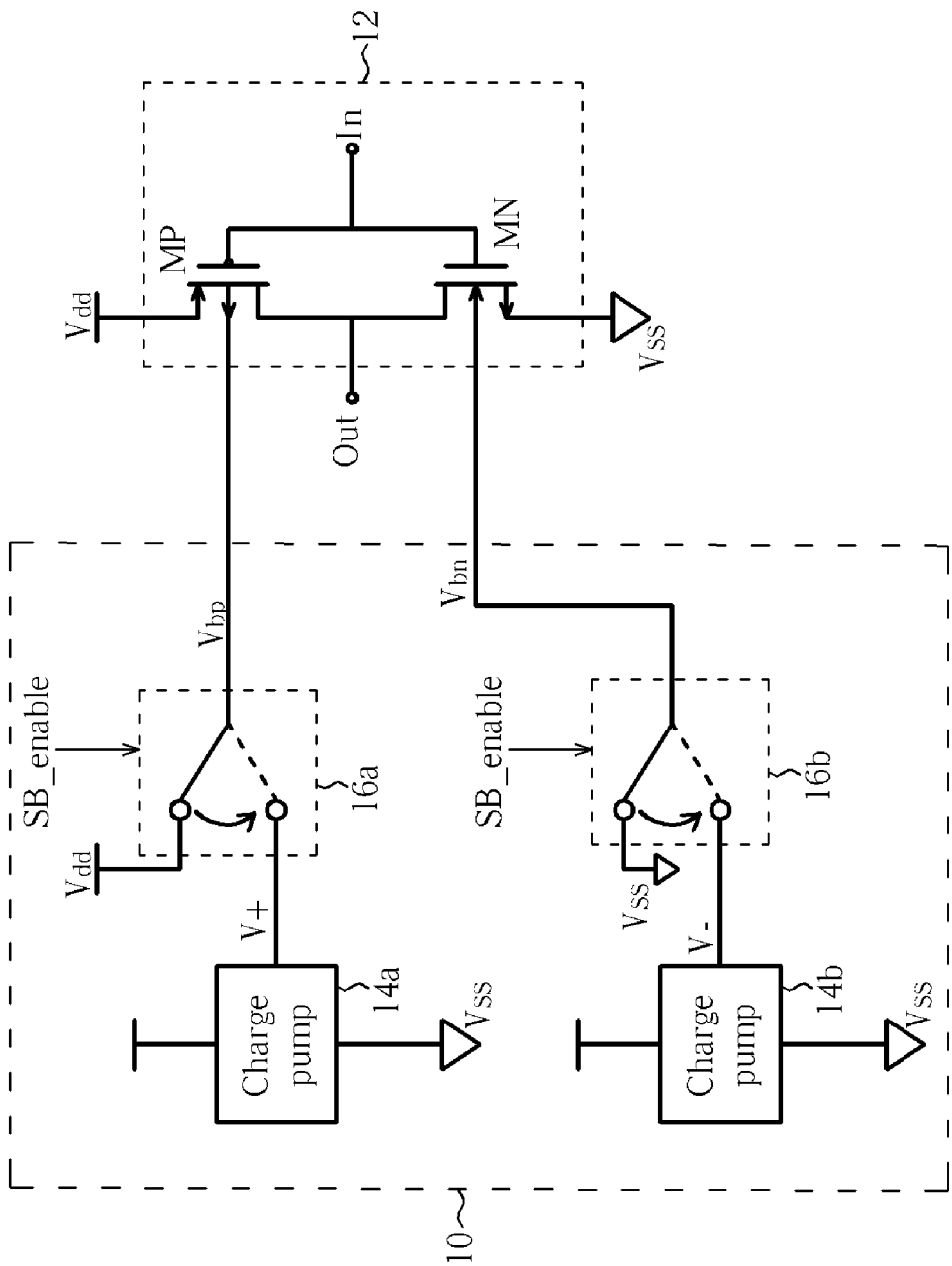
FIG. 1 is diagram illustrating a conventional body biasing apparatus.

When the power managing apparatus 200 operates in a first operating mode that comprises the first circuit connecting configuration, the CMOS circuit 102 is in the normal operation. As described above in reference to FIG. 1, in the normal operation, the source voltage level of the PMOS transistor M1 and the NMOS transistor M2 should be equal to the voltage level of the substrate. For the purpose of description, this embodiment sets Vdd, V1, V2, and Vgnd to be 1.8V, 1.5V, 1V, and 0V, respectively. The voltage switching apparatus 108 controls the first switching device 110 to couple the source of the PMOS transistor M1 to the second voltage source 106, therefore the source voltage of the PMOS transistor M1 is the second reference voltage V2 (i.e., 1V). Additionally, the voltage switching apparatus 108 controls the second switching device 112 to couple the substrate of the PMOS transistor M1 to the second voltage source 106, therefore the substrate voltage of the PMOS transistor M1 is the second reference voltage V2 (i.e., 1V). Additionally, the voltage switching apparatus 108 controls the third switching device 114 to couple the source of the NMOS transistor M2 to the ground voltage Vgnd, therefore the source voltage of the NMOS transistor M2 is 0V.

On the other hand, when power managing apparatus 200 operates in a second operating mode that comprises the second circuit connecting configuration, the CMOS circuit 102 is in the standby mode. As described above in reference to FIG. 1, in the standby mode, the body effect of the PMOS transistor M1 and the NMOS transistor M2 will increase the threshold voltage of the PMOS transistor M1 and the NMOS transistor M2 thereby consequently decreasing the leakage current. Therefore, the voltage switching apparatus 108 controls the first switching device 110 to couple the source of the PMOS transistor M1 to the first voltage source 104, therefore the source voltage of the PMOS transistor M1 is the first reference voltage V1 (i.e., 1.5V). Additionally, the voltage switching apparatus 108 controls the second switching device 112 to couple the substrate of the PMOS transistor M1 to the third reference voltage (e.g., the third reference voltage is the system voltage Vdd in this embodiment, 1.8V). Additionally, the voltage switching apparatus 108 controls the third switching device 114 to couple the source of the NMOS transistor M2 to the second voltage source 106, therefore the source voltage of the NMOS transistor M2 is in this embodiment 0.8V. Accordingly, the substrate voltage of the PMOS transistor M1 is higher than the source voltage 0.3V, and the substrate voltage of the NMOS transistor M2 is higher than the source voltage 0.8V, thereby conforming to the condition of generating the body effect. The CMOS circuit 102 is capable of reducing the leakage current in standby mode and thereby reducing the power loss. Please note that the CMOS circuit 102 is simplified as an inverter in FIG. 2.

Furthermore, in this embodiment of the present invention, to generate the body effect of the PMOS transistor M1 in the standby mode, the first reference voltage V1 that generated of the first voltage generator 104 is a positive voltage, and lower than the third reference voltage (i.e., the system voltage Vdd). However, it is well known that whenever the substrate voltage is higher than the source voltage, the body effect results. Therefore, the present invention is not limited to the positive voltage of the first reference voltage V1 that is generated by the first voltage generator 104. For example, in another embodiment of the present invention, the first voltage generator 104 can be designed to output a first reference voltage V1 that corresponds to a negative voltage which can also drive the PMOS transistor M1 to have the body effect in the standby mode.

Figure 3:
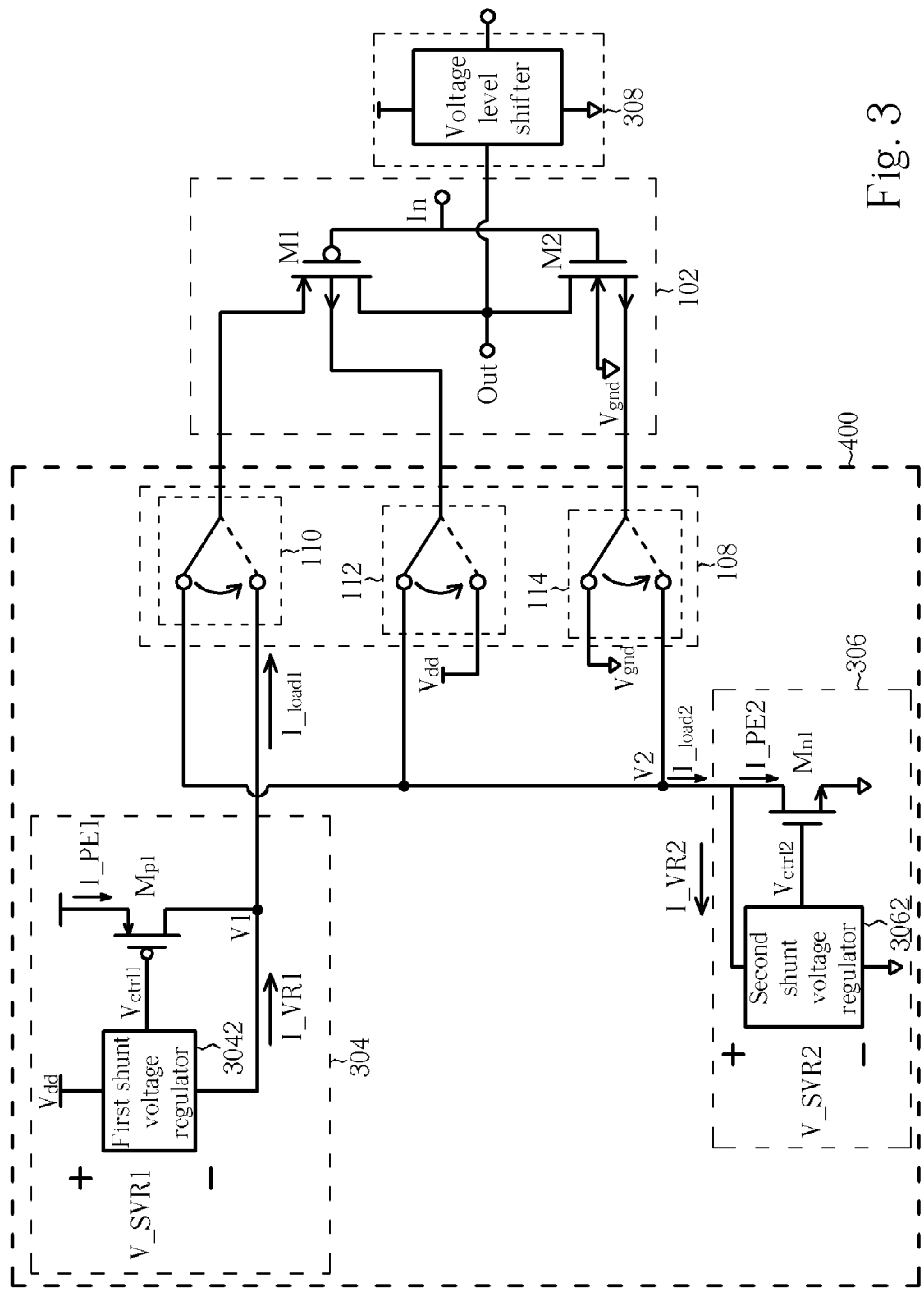
FIG. 3 is a diagram illustrating a power managing apparatus according to a second embodiment of the present invention.

Please refer to FIG. 3. FIG. 3 is a diagram illustrating a power managing apparatus 400 according to a second embodiment of the present invention. In FIG. 3, a voltage level shifter 308 coupled to an output terminal Out of the CMOS circuit 102 is utilized for adjusting a logic level of the output signal. The voltage level shifter 308 is well known to those having average skill in this art, and therefore additional description is omitted for the sake of brevity. The power managing apparatus 400 comprises a first regulating circuit 304, a second regulating circuit 306, and voltage switching apparatus 108. The first regulating circuit 304 is utilized for providing a first reference voltage V1 to the PMOS transistor M1. The second regulating circuit 306 is utilized for providing a second reference voltage V2 to the NMOS transistor M2. The power managing apparatus 400 as shown in FIG. 3 adopts a current reuse method to implement the first regulating circuit 304 and the second regulating circuit 306.

In this embodiment of the present invention, the first regulating circuit 304 comprises a first shunt voltage regulator 3042 and a p-channel pass transistor Mp1, wherein an output terminal of the first shunt voltage regulator 3042 is coupled to the source of the p-channel pass transistor Mp1. The first shunt voltage regulator 3042 provides the first reference voltage V1 of the Vdd-V_SVR1 however, the current is only I_VR1. Furthermore, the total current I_load1 that is consumed by the first regulating circuit 304 can be reused by CMOS circuit 102 because the first regulating circuit 304 is not connected to ground directly. When the current I_load1 changed, the first shunt voltage regulator 3042 adjusts the gate voltage Vctrl1 of the p-channel pass transistor Mp1 to adjust the current I_PE1. Next, the first shunt voltage regulator 3042 provides the current I_load1 as a feedback. Furthermore, the second regulating circuit 306 comprises a second shunt voltage regulator 3062 and an n-channel pass transistor Mn1, wherein an output terminal of the second shunt voltage regulator 3062 is coupled to the source of the n-channel pass transistor Mn1. The second shunt voltage regulator 3062 provides the second reference voltage V2 of the V_SVR2-Vgnd, however, the current is only I_VR2. Furthermore, the total current I_load2 that is consumed by the second regulating circuit 306 is equal to the current of CMOS circuit 102 because the second regulating circuit 306 is not connected to the system voltage Vdd directly. When the current I_load2 of the CMOS circuit 102 changes, the second shunt voltage regulator 3062 adjusts the gate voltage Vctrl2 of the n-channel pass transistor Mn1 to adjust the current I_PE2 then feedbacks to current I_load2. Please note that, this embodiment of the present invention; the shunt voltage regulator is utilized by way of example and not limitation. It is well known to those having average skill in this art that a conventional voltage regulator, a linear regulator, or switching regulator can also be utilized according to the given requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power managing apparatus, for providing a first supply voltage, a second supply voltage, and a substrate voltage of a digital circuit, the power managing apparatus comprising:
    a voltage generating device, for generating a first reference voltage and a second reference voltage;
    a voltage switching device, coupled to the voltage generating device, for selecting the first reference voltage or the second reference voltage to the digital circuit;
    wherein when the digital circuit operates in a first operating mode, the voltage switching device selects the second reference voltage to be the first supply voltage and to be the substrate voltage; and when the digital circuit operates in a second operating mode, the voltage switching device selects the first reference voltage to be the first supply voltage, and selects the second reference voltage to be the second supply voltage.

2. The power managing apparatus of claim 1, wherein the first supply voltage is coupled to a source terminal of a PMOS transistor in the digital circuit and the substrate voltage is coupled to a body terminal of the PMOS transistor.

3. The power managing apparatus of claim 2, wherein the second supply voltage is coupled to a source terminal of an NMOS transistor in the digital circuit.

4. The power managing apparatus of claim 1, wherein the voltage generating device comprises:
    a first voltage regulator, for generating the first reference voltage; and
    a second voltage regulator, for generating the second reference voltage.

5. The power managing apparatus of claim 4, wherein each of the first voltage regulator and the second voltage regulator is a shunt voltage regulator.

6. The power managing apparatus of claim 4, wherein at least one of the first voltage regulator and the second voltage regulator is a linear voltage regulator.

7. The power managing apparatus of claim 4, wherein at least one of the first voltage regulator and the second voltage regulator is a switching voltage regulator.

8. The power managing apparatus of claim 1, wherein each of the first reference voltage and the second reference voltage is a positive voltage.

9. The power managing apparatus of claim 1, wherein the first operating mode is a normal mode.

10. The power managing apparatus of claim 1, wherein the second operating mode is a standby mode.

11. The power managing apparatus of claim 1, wherein the digital circuit is further coupled to a voltage level adjusting apparatus, and the voltage level adjusting apparatus is utilized for adjusting an output level of the digital circuit.

12. A power managing apparatus, for controlling supply voltages of transistors in a digital circuit, the digital circuit comprising at least a PMOS transistor and an NMOS transistor, the power managing apparatus comprising:
    a voltage generating device, for generating a first reference voltage and a second reference voltage; and
    a voltage switching device, coupled to the voltage generating device, for the control of the supply voltages of the PMOS transistor and the NMOS transistor;
    wherein when the digital circuit operates in a first operating mode, the voltage switching device outputs the second reference voltage to a source terminal of the PMOS transistor and a body terminal of the PMOS transistor; and when the digital circuit operates in a second operating mode, the voltage switching device outputs the first reference voltage to the source terminal of the PMOS transistor, and outputs the second reference voltage to a source terminal of the NMOS transistor.

13. The power managing apparatus of claim 12, wherein the voltage generating device comprises:
    a first voltage regulator, for generating the first reference voltage; and
    a second voltage regulator, for generating the second reference voltage.

14. The power managing apparatus of claim 13, wherein each of the first voltage regulator and the second voltage regulator is a shunt voltage regulator.

15. The power managing apparatus of claim 13, wherein at least one of the first voltage regulator and the second voltage regulator is a linear voltage regulator.

16. The power managing apparatus of claim 13, wherein at least one of the first voltage regulator and the second voltage regulator is a switching voltage regulator.

17. The power managing apparatus of claim 12, wherein each of the first reference voltage and the second reference voltage is a positive voltage.

18. The power managing apparatus of claim 12, wherein the first operating mode is a normal mode.

19. The power managing apparatus of claim 12, wherein the second operating mode is a standby mode.

20. The power managing apparatus of claim 12, wherein the digital circuit is further coupled to a voltage level adjusting apparatus, and the voltage level adjusting apparatus is utilized for adjusting an output level of the digital circuit.

* * * * *